United States Patent [19]
Ao et al.

[11] Patent Number: 5,618,738
[45] Date of Patent: Apr. 8, 1997

[54] MANUFACTURING METHOD FOR MAGNETORESISTANCE ELEMENTS

[75] Inventors: Kenichi Ao, Tokai; Minoru Murata, Obu; Hiroki Noguchi, Nishio; Yoshimi Yoshino, Inuyama; Hirofumi Uenoyama, Anjo, all of Japan

[73] Assignee: Nippondenso Co., Ltd., Kariya, Japan

[21] Appl. No.: 404,147

[22] Filed: Mar. 14, 1995

[30] Foreign Application Priority Data

Mar. 14, 1994 [JP] Japan .................................. 6-042682
Feb. 1, 1995 [JP] Japan .................................. 7-015067

[51] Int. Cl.$^6$ ............................................ H01L 21/66
[52] U.S. Cl. .................... 438/3; 360/113; 360/125; 338/13; 324/249; 324/252; 330/62; 438/17
[58] Field of Search .................... 437/8; 360/110, 360/113, 125; 338/13; 324/249, 252; 330/60, 62

[56] References Cited

U.S. PATENT DOCUMENTS

| | | | |
|---|---|---|---|
| 3,747,201 | 7/1973 | Arai | 29/574 |
| 4,034,414 | 7/1977 | Kaminaka et al. | 360/113 |
| 4,679,107 | 7/1987 | Imakoshi et al. | 360/113 |
| 4,833,560 | 5/1989 | Doyle | 360/113 |
| 5,193,038 | 3/1993 | Smith | 338/32 R |
| 5,432,494 | 7/1995 | Inoue et al. | 338/32 R |
| 5,447,781 | 9/1995 | Kano et al. | 360/113 |
| 5,469,317 | 11/1995 | Nagata et al. | 360/113 |

FOREIGN PATENT DOCUMENTS

| | | | |
|---|---|---|---|
| 0284495 | 9/1988 | European Pat. Off. | 360/113 |
| 3277980 | 12/1991 | Japan . | |
| 405217120 | 8/1993 | Japan | 360/113 |

OTHER PUBLICATIONS

"With Ferrite" by TDK Corp in the Nikkan Kogyo Shimbun, Jan. 25, 1986.

*Primary Examiner*—John Niebling
*Assistant Examiner*—Long Pham
*Attorney, Agent, or Firm*—Cushman, Darby & Cushman IP Group of Pillsbury Madison & Sutro LLP

[57] ABSTRACT

A method of manufacturing a magnetoresistance element that can accurately sort out truely defective products from apparently defective products due to the manufacturing processes. Manufacturing processes for MR elements includes a MR element formation process, a magnetic field application process and an electric inspection process. In the magnetic field process, the magnetic field application is limited to a range within 75° to the longitudinal direction of a MR element pattern. By performing the magnetic field application process before the electric inspection process, the anisotropic magnetic field due to a shape magnetic anisotropy of the MR element can be aligned almost in a fixed direction, defective products due to the manufacturing processes can exactly be sorted out from the apparently defective products in the electric inspection process, so that the yield rate can be improved.

17 Claims, 9 Drawing Sheets

MANUFACTURING METHOD FOR MAGNETORESISTANCE ELEMENTS

CROSS REFERENCE TO RELATED APPLICATION

This application is based upon and claims the benefit of priority of the prior Japanese Patent applications No. 6-42682 filed on Mar. 14, 1994 and No. 7-15067 filed on Feb. 1, 1995, the contents of which are incorporated herein by reference.

BACKGROUND OF THE INVENTION

1. Field of the Invention

The present invention generally relates to a method for manufacturing magnetoresistance elements. More particularly, the present invention relates to a method for manufacturing magnetoresistance elements having an improved yield rate.

2. Related Arts

Conventionally, as a means for detecting the rotation of a rotating body, a ferromagnetic thin film magnetoresistance element, whose resistance value varies according to the variation in the magnetic field of the rotating body due to the rotation of the multipolar magnets thereof (hereinafter referred to as "MR element"), has been known.

The MR element is integrated alone or with a transistor, etc., on a semiconductor substrate. As an element, the MR element is composed of a magnet thin film by forming a ferromagnetic material such as Ni-Co alloy, Ni-Fe alloy and Ni-Fe-Co alloy, into a film. When the magnetic thin film is patterned, shape magnetic anisotropy, due to shape effect, is added to the inherent magnetic anisotropy, and the magnetoresistance effect due to the shape magnetic anisotropy of the MR element is used as a sensor. The patterned magnetic thin film is completed as a product through an electric inspection in an inspection process where the patterned magnetic film is tested to determine whether it is defective. In this inspection process, the offset voltage is inspected and the middle point voltage of a bridge circuit constituted by the magnetic thin film is inspected.

SUMMARY OF THE INVENTION

When a characteristic evaluation is made and non-defective products and defective products are sorted out from each other in the above inspection process, it was found that the yield rate of MR elements was excessively low due to a large unevenness in the offset voltage and the middle point voltage.

However, when the defective products sorted out in the inspection process were completed as products and actually used, it was also found that quite a few defective products were able to be used in the same way as the products sorted out as non-defective products during the inspection process.

This means that those products which can be used normally and can also be sorted out as defective products during the inspection process. Specifically, it is presumed that the defective products caused in the MR element manufacturing processes, such as defective products due to film thickness or film quality in film formation or wire width in patterning, and the defective products which are non-defective but judged to be defective in the inspection process, i.e., apparently defective products, are judged to be defective in the inspection process.

Under the circumstances discussed above, it is a primary object of the present invention to provide a method for manufacturing magnetoresistance elements which can more precisely sort out defective products that are defective due to the manufacturing processes from apparently defective products.

It is a secondary object of the present invention to provide a magnetic field applying apparatus for use in the manufacturing of the magnetoresistance elements.

In order to achieve the above objectives, the inventors of the present invention paid attention to the usage of the magnetoresistance element as a product. In the actual use of the magnetoresistance element as a product, an external magnetic field is applied thereto. That is, the MR element patterned and provided with the shape magnetic anisotropy is used under an influence of the external magnetic field. Specifically, the inventors of the present invention presumed that as magnetizing directions of the patterned MR element are aligned in a fixed direction by the external magnetic field in the actual usage, those products which had conventionally been judged to be defective might be used as non-defective products. Based on this presumption, the inventors of the present invention proposed that the above described shape magnetic anisotropy be adjusted before the inspection process.

Therefore, a method for manufacturing magnetoresistance elements according to the first aspect of the present invention comprises a film formation step for forming a magnetic thin film on a substrate, a patterning step for patterning the magnetic thin film into a pattern having long sides and short sides, and an inspection step for electrically inspecting the patterned magnetic thin film, and characterized by having a magnetic field application step for applying a magnetic field to the patterned magnetic thin film before the inspection step.

According to the manufacturing method for magnetoresistance elements of the present invention, as the magnetic field application step is provided for applying a magnetic field to the patterned magnetic thin film before electrically inspecting the patterned magnetic thin film, magnetizing directions of the patterned magnetic thin film are aligned almost in a fixed direction by the applied magnetic field. By this arrangement, the present invention has an excellent effect in that defective products that are defective due to the manufacturing processes can be accurately sorted out from apparently defective products in the subsequent inspection step and thereby improve the yield rate.

On the other hand, a magnetic field applying apparatus for use in the magnetic field application step of the first aspect of the present invention is characterized by comprising a locking means for locking a substrate with the patterned magnetic thin film formed thereon and a magnetic field generating means for generating a magnetic field in a fixed direction into which the locking means can be inserted.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Specifically, a method of manufacturing magnetoresistance elements according to the present invention comprises a film formation step for forming a magnetic thin film on a substrate, a patterning step for processing the magnetic thin film into a pattern having long sides and short sides, and an inspection step for electrically inspecting the patterned magnetic thin film, wherein this manufacturing method further comprises a magnetic field application step, after the patterning step and at least before the inspection step, for applying a magnetic field to the patterned magnetic thin film, and wherein the magnetic field application direction in the magnetic field application step is within a range in which an angle of the magnetic field application direction with the lengthwise side direction of the patterned magnetic thin film is 75° or less.

Figure 6:
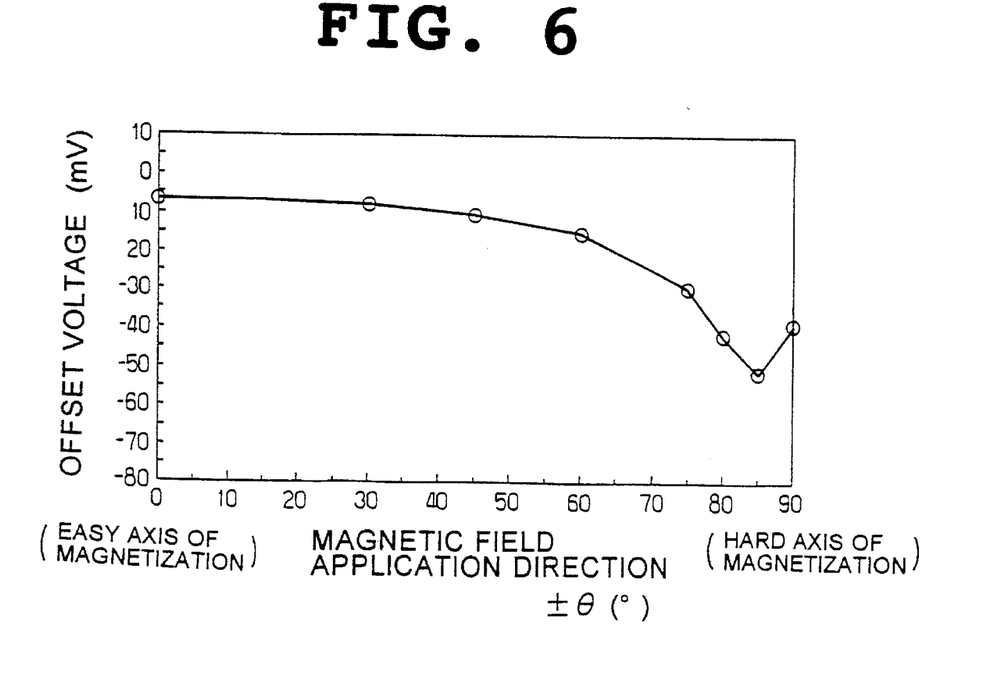
FIG. 6 is a graph showing the relationship between the offset voltage and the magnetic field application direction.
Figure 7:
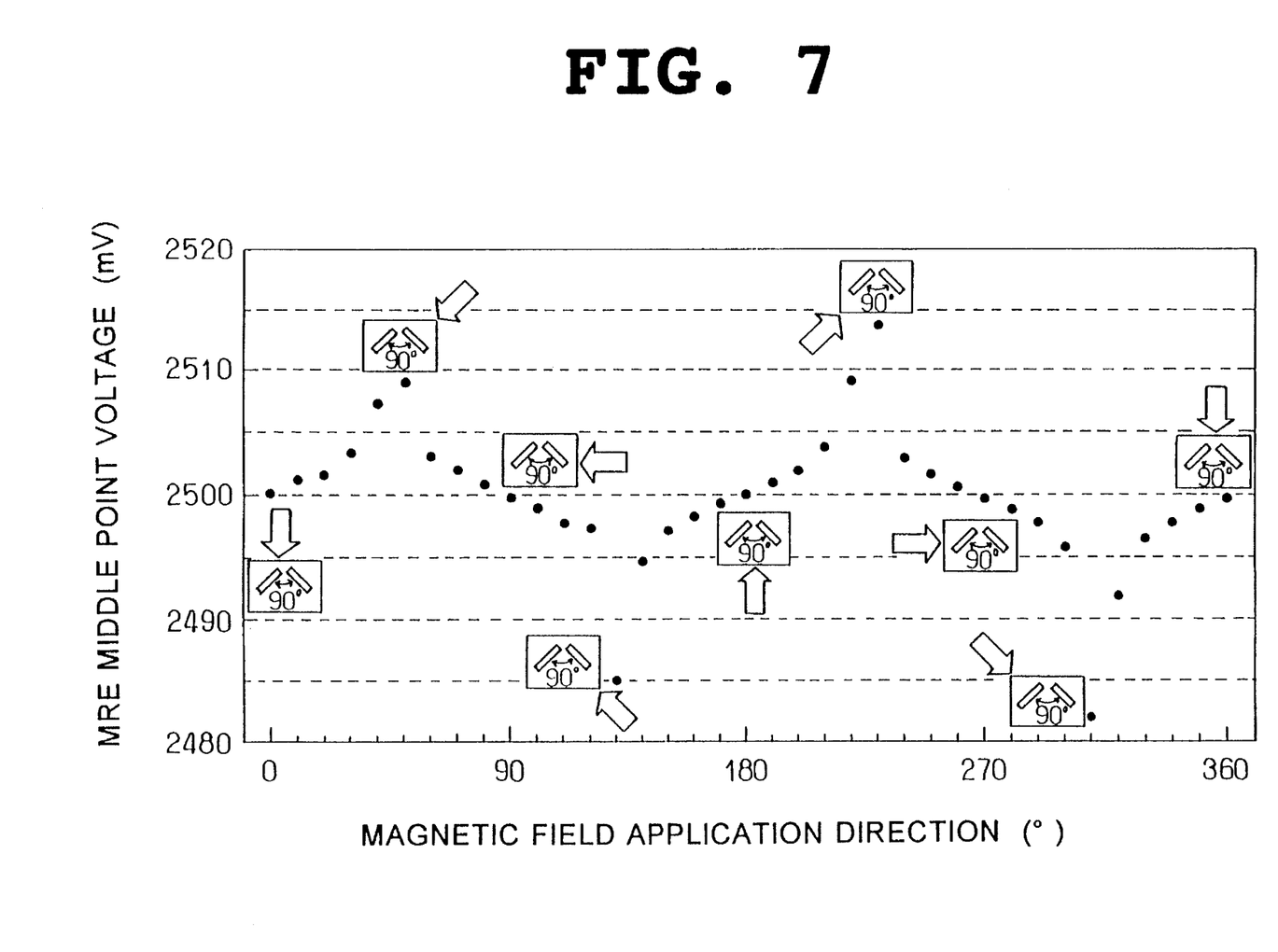
FIG. 7 is a graph showing the relationship between the offset voltage and the magnetic field application direction.

According to the manufacturing method for magnetoresistance elements of the present invention, by applying a magnetic field to the patterned magnetic thin film within a range in which an angle of the magnetic field application direction with the lengthwise side direction of the patterned magnetic thin film is 75° or less before electrically inspecting the patterned magnetic thin film, magnetizing directions of the patterned magnetic thin film are aligned almost in a fixed direction by the applied magnetic field, as illustrated in FIG. 6 or 7. Therefore, unevenness in the offset voltage and the middle point electric potential caused by the influence of the external magnetic field during the manufacturing processes can be rectified. As a result, the present invention has an excellent effect that truly defective products that are defective due to the manufacturing processes can be sorted out more accurately from apparently defective products in the inspection step, thereby improving the yield rate of the magnetoresistance elements.

Figure 5:
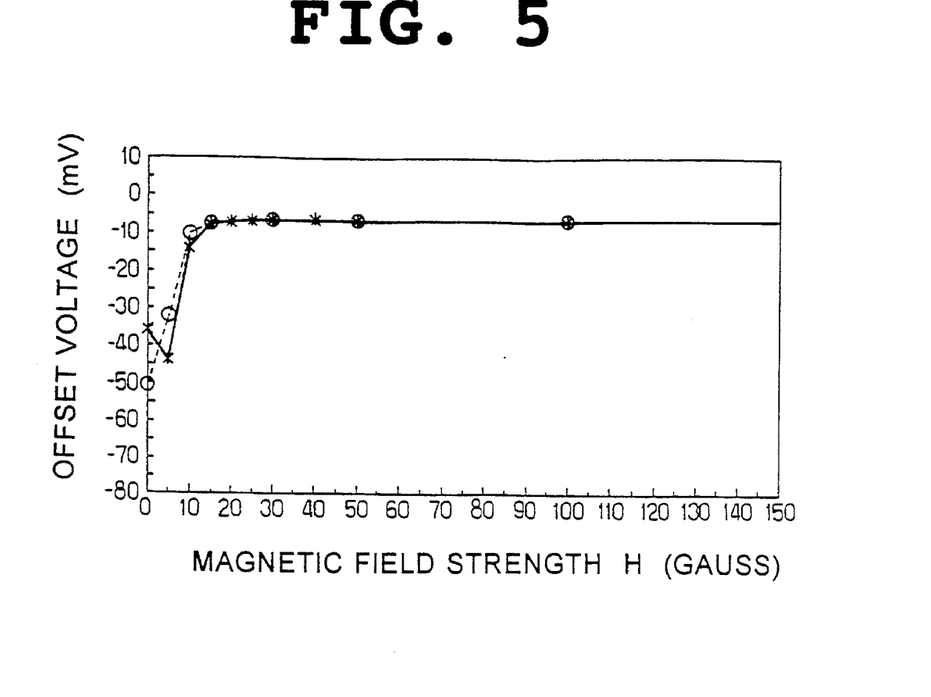
FIG. 5 is a graph showing the relationship between the offset voltage and the magnetic field application strength.

Furthermore, the magnetic field application strength in the magnetic field application step is preferably higher than the saturation magnetic field of the lengthwise side direction of the patterned magnetic thin film. When a magnetic field, whose strength is higher than the saturation magnetic field in the lengthwise side direction of the pattern is applied, magnetizing directions of the patterned magnetic thin film can be effectively aligned almost in a fixed direction as illustrated in FIG. 5, whereby the unevenness in the offset voltage and in the middle point voltage due to the influence of the external magnetic field during the manufacturing processes can be rectified. Therefore, the present invention has an excellent advantage that non-defective products and defective products can be accurately sorted out from each other and thereby the yield rate can be improved.

Figure 8:
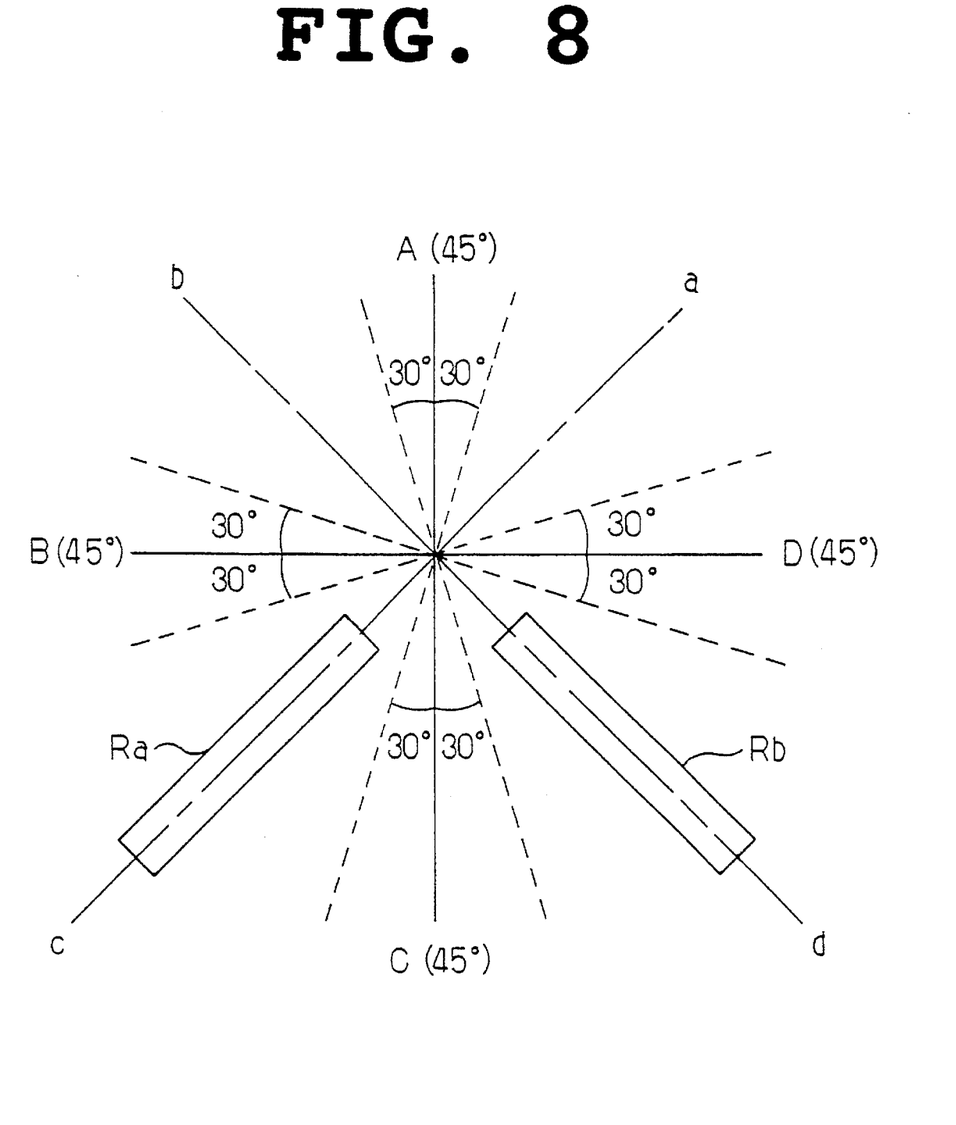
FIG. 8 is a chart showing the relation between the offset voltage and the magnetic field application direction.

Furthermore, the magnetoresistance element preferably has at least two different magnetic thin film patterns provided in different directions crisscrossed at a right angle, and the magnetic field application direction in the magnetic field application step might preferably be within ±30° from the reference direction at an angle of 45° with the lengthwise directions of the respective magnetic thin film patterns. When the magnetic field application direction in the magnetic field application step is set to be within ±30° from the reference direction at an angle of 45° with the lengthwise directions of the respective magnetic thin film patterns, as shown in FIGS. 7 and 8, the unevenness in the middle point voltage of the two different patterns can be reduced. Therefore, the present invention has an excellent effect in that non-defective products and defective products can be accurately sorted out from each other and thereby the yield rate can be improved.

Furthermore, a plurality of magnetoresistance elements are preferably formed on the substrate in a fixed pattern, and the magnetic field is preferably applied to the plurality of magnetoresistance elements formed on the substrate at the same time. In this arrangement, the plurality of magnetoresistance elements can be efficiently subjected to the magnetic field application at one time.

Also, in the above manufacturing method for magnetoresistance elements, when the magnetic field application step is provided immediately before the inspection step, defective products that are defective due to the manufacturing processes can be sorted out more exactly from apparently defective products.

Moreover, the magnetic field applying apparatus for use in the magnetic field application step of the present invention comprises a locking means for locking a substrate with the patterned magnetic thin film formed thereon, and a magnetic field generating means for generating a magnetic field in a fixed direction into which the locking means can be inserted. Therefore, the present invention has an excellent effect in that the magnetic field can easily be applied to the patterned magnetic thin film in a fixed direction.

Also, in the above magnetic field applying apparatus, it is preferable that the substrate is circular and has a chord part linearly cut off from a part of the circumference of the substrate and that the locking means for locking the substrate locks the substrate by contacting the chord part. In this arrangement, the substrate can easily be locked, and the magnetic field application direction is not uneven among the wafers but is uniform in a fixed direction.

In addition, in the magnetic field applying apparatus, when the magnetic field applying means has an air-core coil, the locking means can easily be inserted into the air-core coil and at the same time the magnetic field can easily be applied in a fixed direction.

An embodiment of a method of manufacturing magnetoresistance elements according to the present invention will now be described based on a manufacturing method for ferromagnetic thin film magnetoresistance elements (MR elements) formed on a semiconductor substrate.

Figure 1:
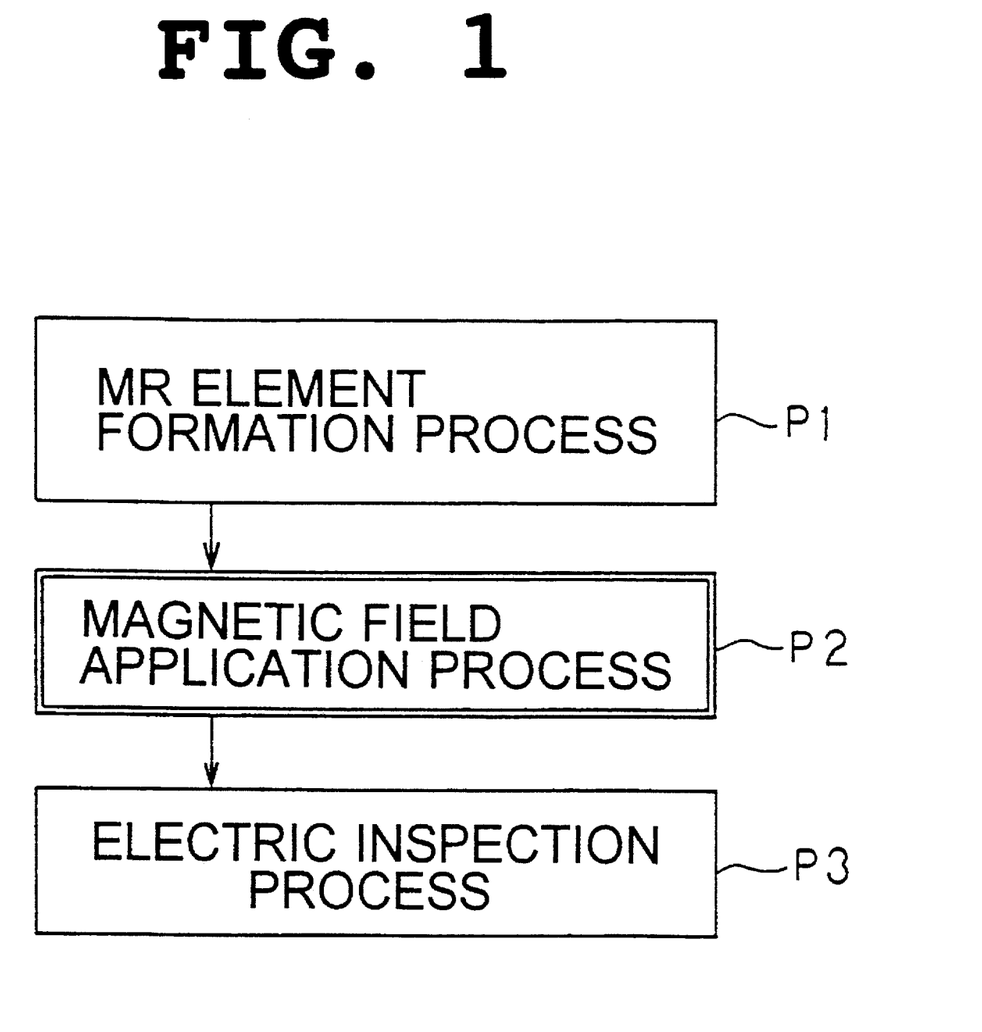
FIG. 1 is a process flow chart illustrating an embodiment of the method of manufacturing a magnetoresistance element.

In brief, the manufacturing method for the MR elements according to this embodiment comprises an MR element formation process P1, a magnetic field application process P2, and an electric inspection process P3 to be performed in this order as illustrated in FIG. 1. A characteristic of the present embodiment is that the magnetic field application process P2 is provided after the MR element formation process P1 and before the electric inspection process P3.

In the conventional technique, the magnetic field application process P2 is not included. As a result, products which should be judged to be non-defective are judged to be defective. However, by additionally providing the magnetic field application process P2 before the electric inspection process P3 as this embodiment does, apparently defective products can be judged to be non-defective, and thereby the yield rate of the MR elements can be improved by performing the magnetic field application process P2.

With respect to the above, the present inventors are of opinion as follows referring to the following literature:

According to the article entitled "With Ferrite" by TDK Corp., The Nikkan Kogyo Shimbun, Jan. 25, 1986, a magnetic material such as ferrite is composed of crystal particles like polycrystals called "grains" (which appears as chunks of cheese through an electron microscope) which are composed of ferrite crystal microstructures called "unit cells" (composed of 32 oxygen ions and 24 metal ions). Here, the accumulated magnetism of the unit cell caused by the atomic magnetic moment works as the magnetism of the grain. The grain, however, is divided into several magnetic domains having atomic magnetic moments exactly opposite to each other by a partition called a "magnetic domain wall" to mitigate the powerful magnetic pole energy of the grain itself until the stable state of energy is obtained. Receiving the application of external magnetic field, this magnetic domain wall moves through the inside of the grain while changing the atomic magnetic moments so that either magnetism can be dominant over the other, and finally the magnetic domain wall disappears. Upon the disappearance of the magnetic domain wall, the grain turns to be a single domain expressing one-directional magnetism (a grain having a clearly distinctive N pole and S pole).

Based on this idea, a description will further be developed with respect to a MR element composed of NI-Co alloy and other components.

When patterned into a rectangle (described herein later), a magnetic thin film composed of Ni-Co alloy, Ni-Fe alloy, Ni-Fe-Co alloy, etc. is divided into a longitudinal direction called an "easy axis of magnetization" and a transverse direction called a "hard axis of magnetization," and magnetism appears more strongly in the longitudinal direction which is stable in terms of energy (shape anisotropic magnetic field by patterning).

However, as described above, the patterned magnetic thin film is an aggregate of the grains after all internally having magnetic domain walls and magnetic domains with different magnetic moments. That is, due to the existence of the magnetic domain wall, MR elements have different characteristics according to respective patterns, and if unevenness in the characteristics is large, some MR elements may be judged to be defective in the inspection process P3.

Hinted by the fact that the magnetic domain wall moves under the effect of the external magnetic field and finally disappears, the inventors of the present invention added the magnetic field application process P2 to the manufacturing method to judge apparently defective products to be non-defective in the inspection process P3 by arranging that the characteristics of magnetoresistance elements as products can be obtained through the adjustment of the magnetic domain wall. This magnetic field application process P2 will be explained in detail herein later.

Now, the manufacturing processes for MR elements will be described more in detail.

Figure 2:
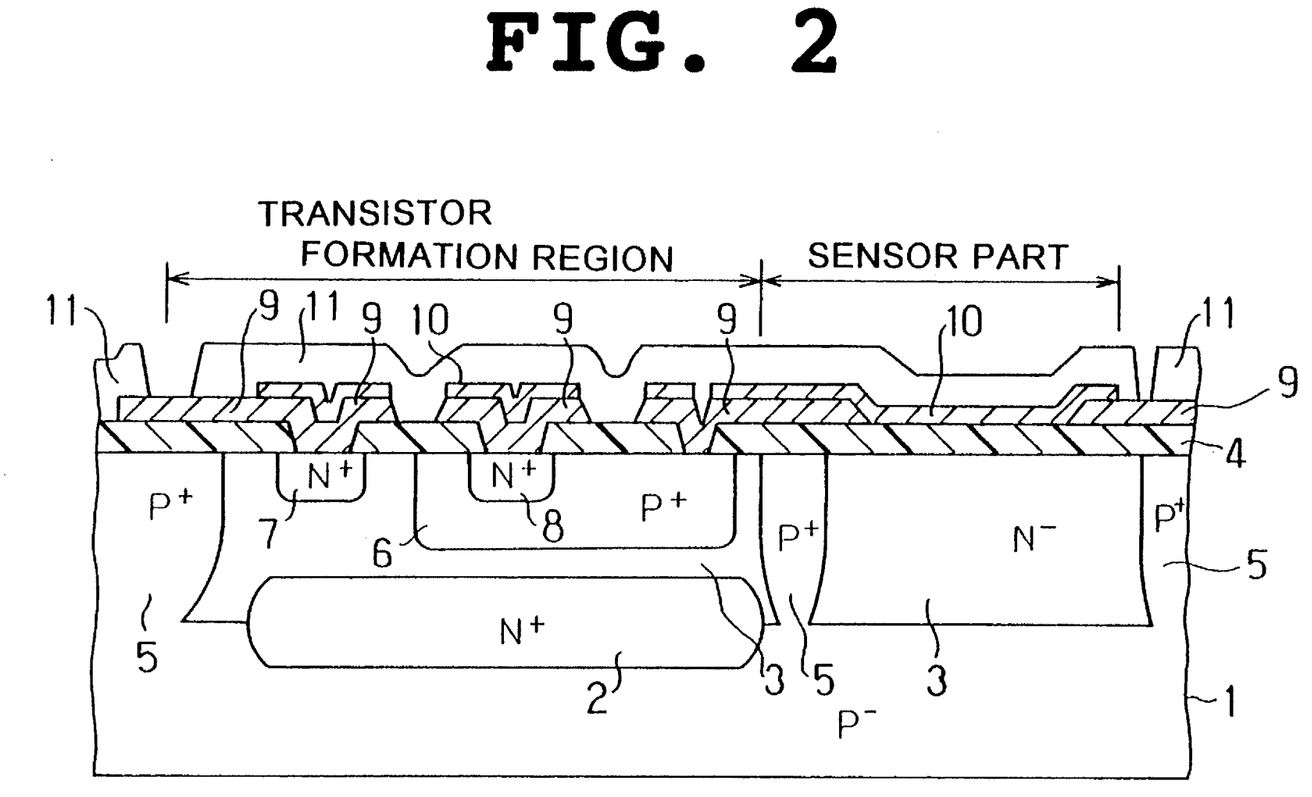
FIG. 2 is a cross-sectional view of integrated MR elements formed on the semiconductor substrate.

In the MR element formation process P1, as illustrated in FIG. 2, an $N^+$-type buried layer 2 and an $N^-$-type epitaxial layer 3 are formed on the main surface of a semiconductor substrate ($P^-$-type) 1. Following this, a silicon oxide film 4 is formed on the main surface of the $N^-$-type epitaxial layer 3 using a CVD (chemical vapor deposition) apparatus. Then, the silicon oxide film 4 is photoetched to a desired circuit pattern, forming a $P^+$-type element isolation region 5, a $P^+$-type diffusion region 6 and $N^+$-type diffusion regions 7 and 8. In this way, a vertical type NPN bi-polar transistor is composed of the $N^+$-type buried layer 2, the $N^-$-type epitaxial layer 3, the $P^+$-type diffusion region 6 and $N^+$-type diffusion regions 7 and 8. This transistor is designed to amplify signals received from a ferromagnetic thin film magnetoresistance element 10 (described herein later).

In the next step, contact parts are selectively formed on the silicon oxide film 4 by the photoetching method. Then, a wiring material, such as aluminum, is accumulated on the contact parts to form a wiring layer. Following this, a ferromagnetic material, such as Ni-Co alloy, is accumulated on the wiring layer, and the accumulation is photoetched to form a MR element pattern. The MR element pattern is a resistor having a resistance in a range from 100Ω to several 10 kΩ, a thickness in a range from 100Å to 3,000Å, a wire width in a range from several µm to several 10 µm and a length in a range from several 100 µm to several 10 mm. Finally, a protective film 11 is formed on the MR element pattern to finish an integrated MR element.

Now, the magnetic field application process P2 of MR elements will be described in detail. In this embodiment, a MR element in which an element pattern is composed into a bridge circuit is referred to by way of example.

Figure 3A:
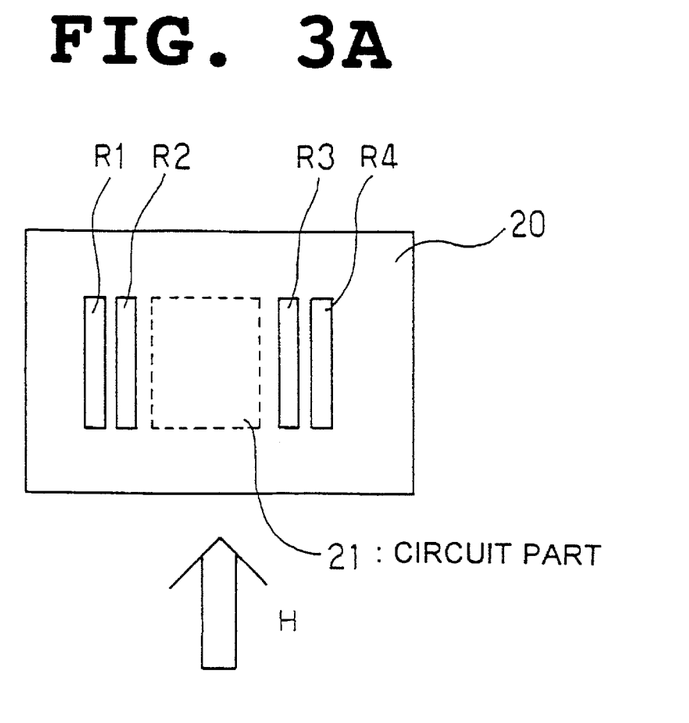
FIG. 3A is a schematic view illustrating one MR element pattern.
Figure 3B:
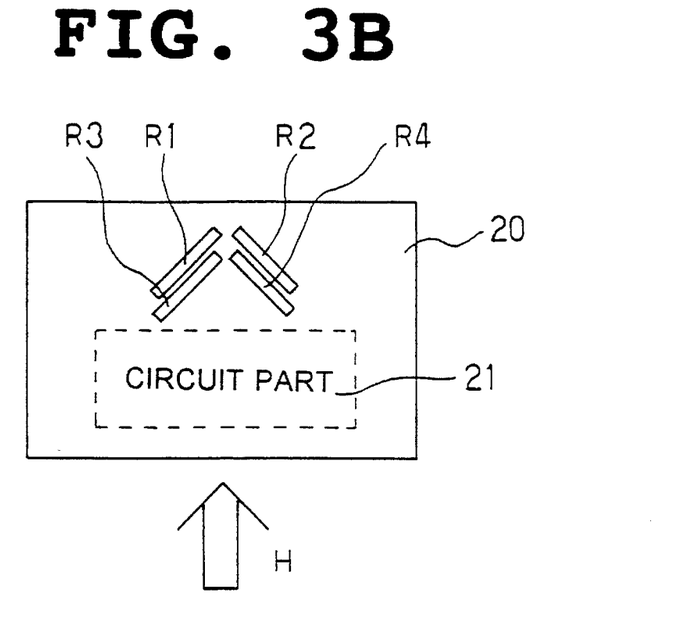
FIG. 3B is a schematic view illustrating the other MR element pattern.

FIGS. 3A and 3B illustrate a patterned MR element. A MR element 20 forms a bridge circuit by combining four different MR element patterns R1 to R4. FIG. 3A illustrates a bridge circuit in which all the MR element patterns R1 to R4 are laid out in parallel with each other, while FIG. 3B illustrates a bridge circuit in which the MR element patterns R1 and R3 and the MR element patterns R2 and R4 are laid out in a crisscrossed pattern in the longitudinal direction at an almost right angle with respect to each other. Incidentally, a part indicated by a broken line in both figures is a signal processing part 21 for transistor, etc.

Figure 4A:
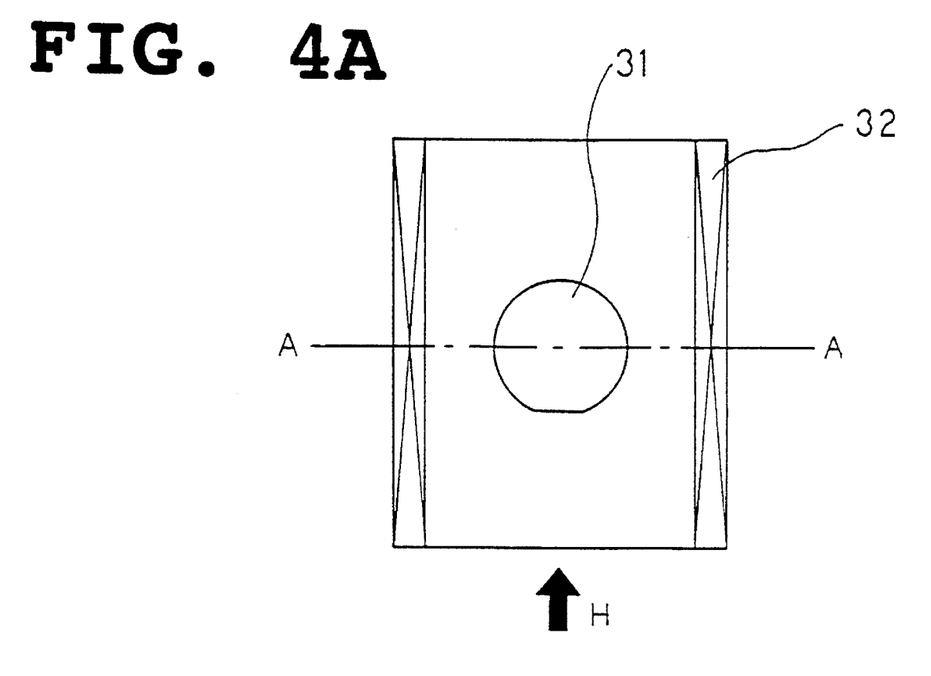
FIG. 4A is a schematic view illustrating the magnetic field application process.
Figure 4B:
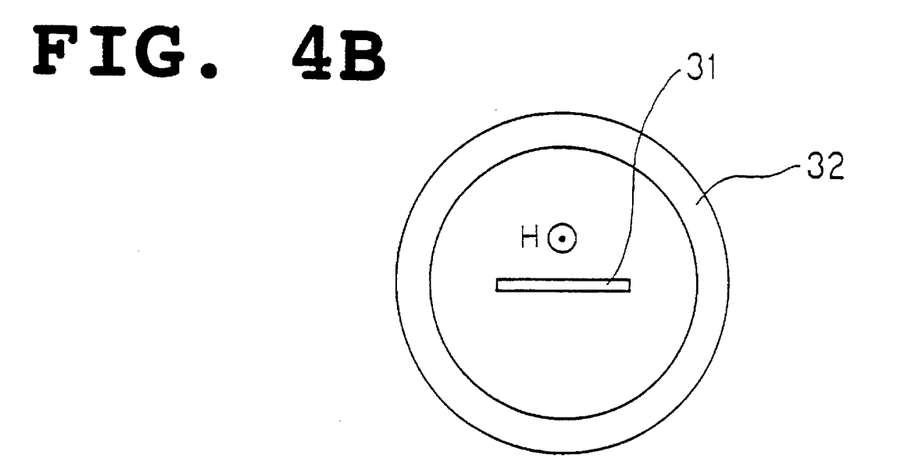
FIG. 4B is a cross-sectional view taken along line 4B—4B of FIG. 4A.

A magnetic field is applied to the above described MR element from a direction indicated by an arrow H. FIGS. 4A and 4B typically illustrates the insertion of the MR element illustrated in FIGS. 3A and 3B in a state of a wafer. The reference numeral 31 denotes a wafer in which a plurality of MR elements have been formed, and the reference numeral 32 denotes an air-core coil. FIG. 4A is a cross-sectional view illustrating the state in which the wafer 31 has been inserted into the air-core coil 32, while FIG. 4B is a cross-sectional view taken along line 4B—4B of FIG. 4A. This air-core coil 32 is arranged so that a magnetic field is generated in the direction H indicated in this figure. Incidentally, this magnetic field application process P2 can be performed at a room temperature. If the magnetic field application process P2 is performed at a high temperature, such as the Curie temperature, it is possible, for example, to somewhat rectify defectives in the film quality of a magnetic thin film and thereby improve the yield rate.

Next, FIG. 5 illustrates the relation between the magnetic field application strength and the offset voltage Voff. The offset voltage Voff indicates a middle point voltage when the MR element patterns R1 to R4 illustrated in FIG. 3A are laid out in parallel with each other to form a bridge circuit and a magnetic field is not applied to the bridge circuit. Incidentally, the direction of the magnetic field application is supposed to be the longitudinal direction (long side direction) of the pattern, i.e., the easy axis of magnetization.

From FIG. 5, it is understood that when a magnetic field strength of approximately 20 G (G: gauss) or more is applied, the offset voltage Voff becomes constant. The 20 G is almost the same strength as the saturation magnetic field in the longitudinal direction of the MR element pattern.

On the other hand, FIG. 6 illustrates the relation between the magnetic field application direction and the offset voltage Voff. The magnetic field direction θ is referred to the longitudinal direction, and 0° is the longitudinal direction and 90° is the transverse direction. In this figure, the code ±θ means that the magnetic field application direction is angled left or right from the longitudinal direction.

From FIG. 6, it is understood that when the magnetic field is applied in the longitudinal direction, the offset voltage Voff can be reduced more greatly. Incidentally, from this figure, when the magnetic field application is inclined from the longitudinal direction (easy axis of magnetization) by over ±75°, the offset voltage Voff can not be improved so much. Therefore, when the magnetic field application is within ±75° from the longitudinal direction, the offset voltage Voff can be improved significantly, and when the magnetic field application is within ±60°, the offset voltage Voff can sufficiently be improved. The reference of the magnetic field application to ±75° from the longitudinal direction corresponds to the range of 75° from the lengthwise direction of the magnetic thin film pattern.

FIG. 7 illustrates the unevenness in the middle point voltage (offset voltage) with respect to the magnetic field application direction of the MR element pattern illustrated in FIG. 3B. The unevenness in the middle point voltage was examined as to two different patterns patterned and crisscrossed at a right angle as illustrated in FIG. 3B by rotating the magnetic field application. Having supposed that the magnetic field application direction is 0° at 135° from the two different patterns respectively, the magnetic field application was rotated 360° at a pitch of 10°.

In FIG. 7, when the magnetic field application directions are within ranges of 30° to 60°, 120°, to 150°, 210° to 240° and 300° to 330°, the middle point voltage is greatly uneven with no effect of reducing the unevenness in the middle point voltage. Within these ranges, the magnetic field application direction is over 75° with the longitudinal direction in either of the two different patterns crisscrossed at a right angle. Therefore, it can be said that when a magnetic field is applied in a wide angle region excluding these ranges, there should be the effect of reducing the unevenness in the middle point voltage.

In short, as shown in FIG. 8, when a direction A at an angle of 45° with the longitudinal directions (lengthwise direction) a and b of the two different MR element patterns Ra and Rb crisscrossed at a right angle respectively, direction B at an angle of 45° with the longitudinal directions b and c respectively, a direction C at an angle of 45° with the longitudinal directions c and d respectively, and direction D at an angle of 45° with the longitudinal directions d and a respectively are used as references, it can be said that if the magnetic field application directions are within 30° from the respective directions toward the longitudinal directions, there should be the effect of reducing the dispersion in the middle point voltage. These longitudinal directions a, b, c and d correspond to the lengthwise directions of the crisscrossed magnetic thin film patterns, and the directions A, B, C and D correspond to the directions at an angle of 45° with respect to the lengthwise directions of the crisscrossed magnetic thin film patterns. Additionally, ±30° referred to in the present invention can be interpreted referring to the direction A in FIG. 8 that +30° means 30° toward the side of the longitudinal direction a and −30° means 30° toward the side of the longitudinal direction b.

Figure 9A:
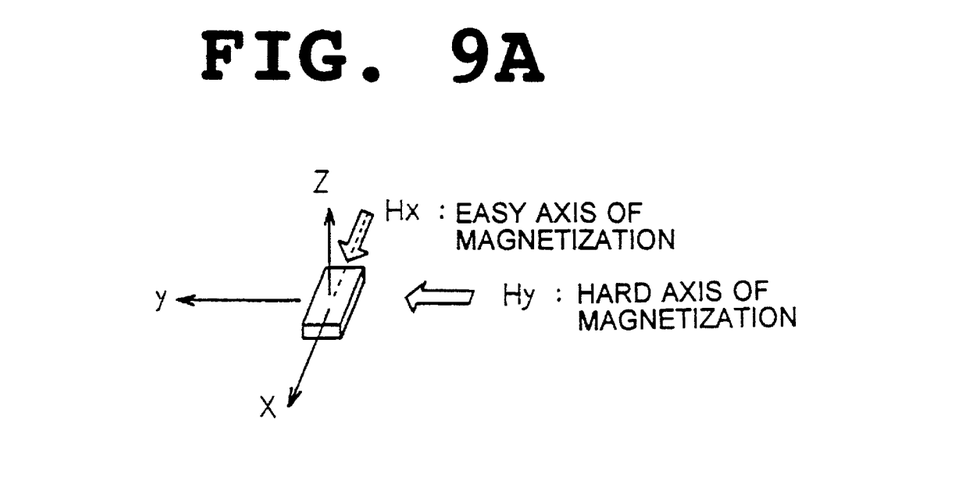
FIG. 9A is a schematic view illustrating the magnetic field application direction.

Now, referring to FIGS. 9A and 9B, the reason why the magnetic field should preferably be applied in the longitudinal direction will be explained.

Figure 9B:
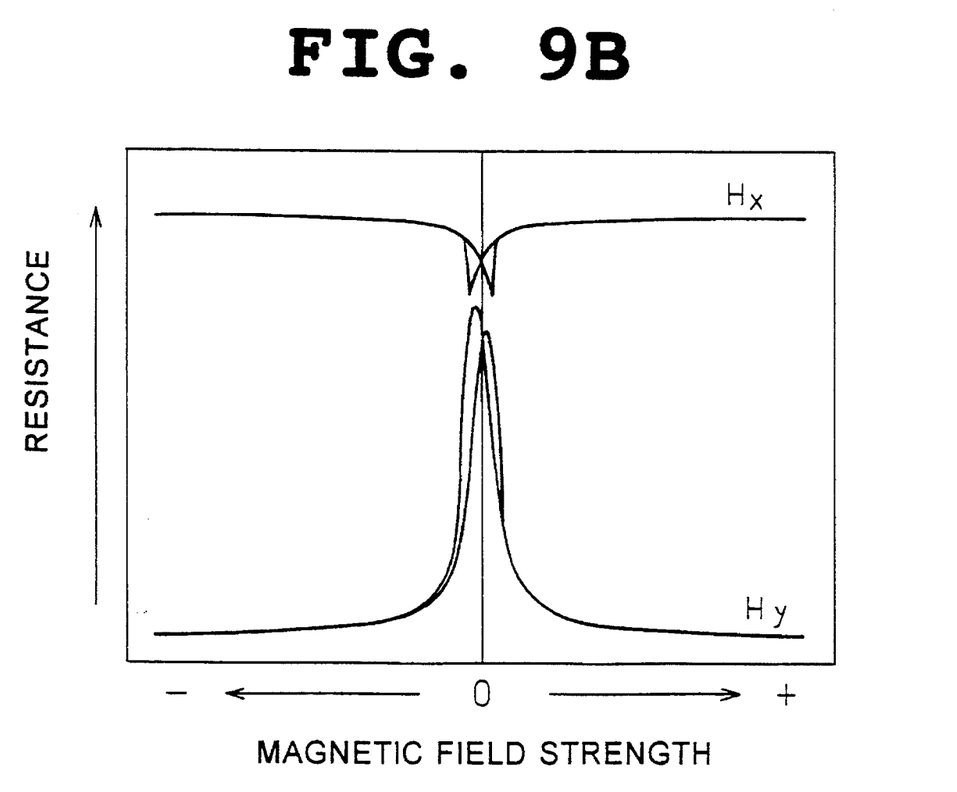
FIG. 9B is a graph showing the relationship between the resistance variation and the magnetic field application direction.

FIG. 9B illustrates the relation between the magnetic field application strength and the resistance value. In FIG. 9A, the longitudinal direction of the pattern is X and the magnetic field applied in the direction X is Hx, and the transverse direction of the pattern is Y and the magnetic field applied in the direction Y is Hy. Here, it is supposed that these magnetic fields Hx and Hy are applied in parallel with the respective directions X and Y, and the directions indicated by arrows in FIG. 9A are plus (+), and the directions in opposition to the respective directions X and Y are minus (−).

From these figures, it is understood that when the magnetic field is applied in the longitudinal direction X, the variation in the resistance value is smaller compared with the transverse direction Y. That is, the reason why the offset voltage Voff can be reduced when a magnetic field is applied in the longitudinal direction of the MR element pattern illustrated in FIG. 6 is that the MR element pattern has small a variation in resistance value against the magnetic field applied in the longitudinal direction. Therefore, compared with the magnetic field application in the transverse direction, when the magnetic field is applied in the longitudinal direction, the directions of magnetization can be aligned more easily, unevenness in the resistance value among the MR elements can be reduced, and unevenness in the offset voltage Voff can also be reduced. In other words, when a magnetic field is applied in the longitudinal direction, apparently defective products can more accurately be judged to be non-defective.

Next, the electric inspection process P3 for the MR elements will be described.

In this electric inspection process, as well as the electric inspection of IC elements such as transistors formed in the MR element formation process P1, a bridge middle point electric potential (offset voltage Voff) into which such MR element patterns, as illustrated in FIGS. 3A and 3B, is incorporated into a bridge circuit, is inspected. By measuring the middle point electric potential, non-defective MR elements are sorted out from defective MR elements.

The above process arrangement was experimented by the inventors of the present invention. As a result, it was found that the unevenness in the offset voltage had been reduced to be ½ or less and the yield rate had been improved from 35% to 90%.

Incidentally, in this embodiment, the magnetic field application process P2 is performed immediately before the electric inspection process P3. Almost the same effect can be obtained, however, even if the magnetic field application process P2 is not performed immediately before the electric inspection process P3, if the magnetic field application process P2 is performed after the patterning process in the MR element formation process P1. In this case, however, care should be directed to the existence of the magnetic field effect due to other manufacturing processes, etc. before the electric inspection process P3.

In the above embodiment, though a case where bi-polar ICs are formed on the semiconductor substrate 1, a case where circuits of MOS structure or Bi-CMOS structure are formed may also be applicable in the same way. Also, this embodiment may be applied to discrete MR elements.

Next, a magnetic field applying apparatus to be used in the magnetic field application process P2 will be described.

Figure 10:
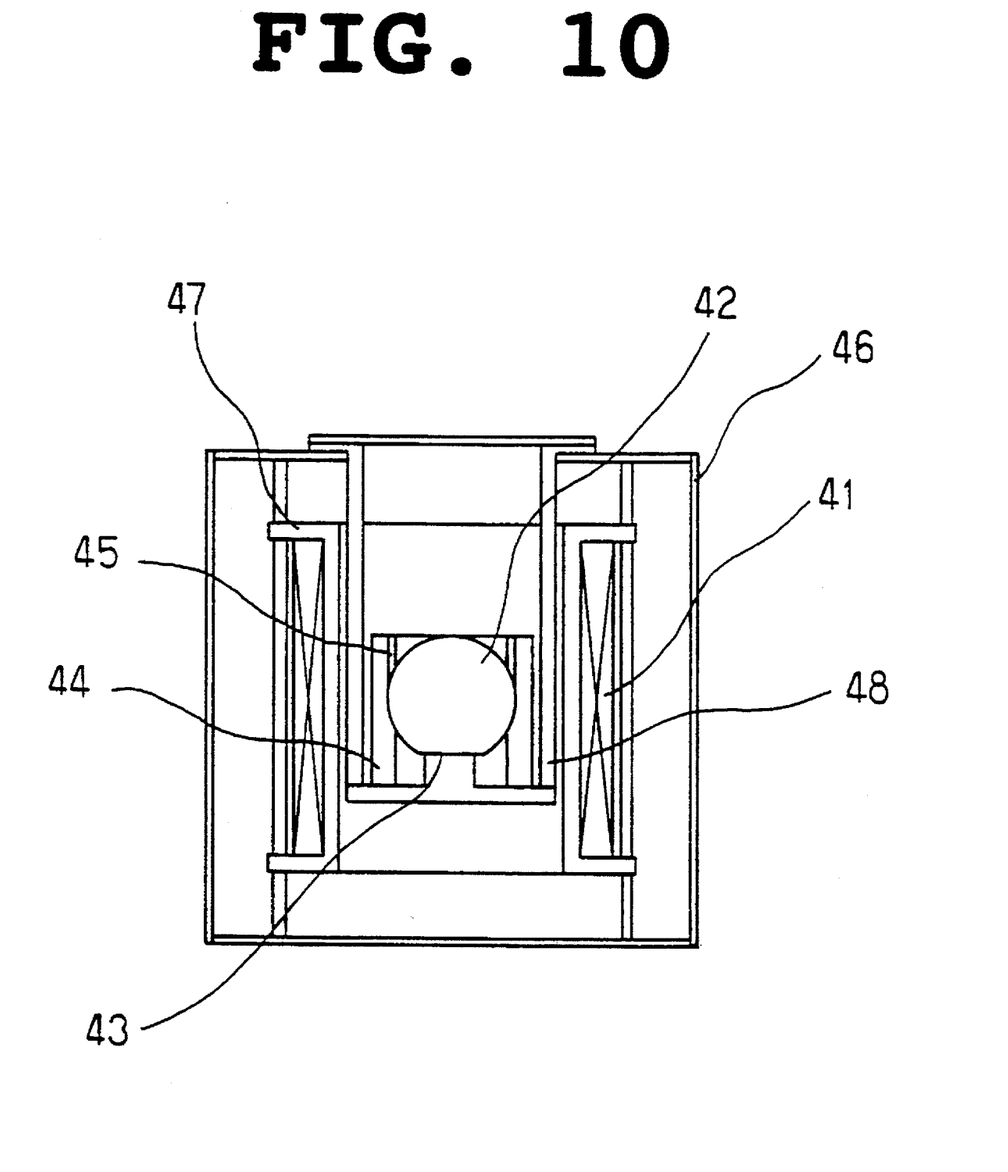
FIG. 10 is a view illustrating a magnetic field applying apparatus.

In FIG. 10, the reference numeral 47 is a bobbin made of a non-magnetic material such as Bakelite, around which a conductor is wound to form an air-core coil 41. This air-core coil 41 can easily generate a magnetic field in a fixed direction. The reference numeral 46 is a container made of non-magnetic material for housing the air-core coil 41. The reference numeral 48 is a case introducing jig for a wafer case 44, which is made of non-magnetic material, such as Delrin, for guiding the wafer case 44 into the air-core coil 41. By using the case introducing jig 48, the wafer case 44 can always be inserted into the air-core coil 41 in a fixed direction. The reference numeral 42 is a silicon wafer on which MR element patterns have been formed. A plurality of silicon wafers 42 are set along a guide part 45 within the wafer case 44 made of Teflon or other material in such a way that each silicon wafer 42 does not contact to each other. The reference numeral 43 is a projection part for locking the direction of the silicon wafer 42 within the air-core coil 41, to which an orientation flat of the silicon wafer 42 contacts to lock the silicon wafer 42. By locking the direction of the silicon wafer by using the orientation flat, the direction of each silicon wafer 42 can easily be locked in a fixed direction, and therefore, there is no possibility of unevenness in the magnetic field application direction among the silicon wafers 42.

In the magnetic field applying apparatus as illustrated in FIG. 10, when current flows through the air-core coil 41, a magnetic field indicated by H=n×i (H: magnetic field strength, n: number of coil turns, i: flowing current) is generated in parallel with the central axis of the air-core coil 41. Here, it is supposed that the MR element patterns have been formed in such a way that the direction of the magnetic field H and the orientation flat are almost vertical to each other on the silicon wafer 42 locked as described above. The size of the air-core coil 41 is such that the length and the inside diameter thereof are set according to the size of the silicon wafer 42 and such that the direction of the magnetic field within the air-core coil 41 is almost parallel with the center axis of the air-core coil 41 or inclined at most ±20° or less to the center axis of the air-core coil 41 within the surface of the silicon wafer 42 to which the magnetic field is to be applied.

The magnetic field applying apparatus is not limited to the above air-core coil 41 but may be any means which can generate a magnetic field in a fixed direction.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a magnetoresistance element comprising the steps of:

forming a magnetic thin film on a substrate;

patterning said magnetic thin film into a pattern having long sides and short sides;

applying a magnetic field to said patterned magnetic thin film after said patterning step, wherein a direction of said magnetic field applied to said patterned magnetic thin film in said applying step is at an angle no greater than 75° with respect to a lengthwise direction of said patterned magnetic thin film; and testing said patterned magnetic thin film after said step of applying a magnetic field to said patterned magnetic thin film to determine whether said patterned thin film is defective.

2. The method of manufacturing a magnetoresistance element according to claim 1, wherein a magnetic field application strength in said magnetic field application step is more than a saturation magnetic field in said lengthwise direction of said patterned magnetic thin film, said saturation magnetic field being a magnetic field strength at a time when a variation in a resistance of said magnetoresistance element becomes constant when a magnetic field is applied to said patterned magnetic thin film.

3. A method of manufacturing a magnetoresistance element comprising the steps of:

forming a magnetic thin film on a substrate;

patterning said magnetic thin film into a pattern having long sides and short sides;

applying a magnetic field to said patterned magnetic thin film after said patterning step, wherein a direction of said magnetic field applied to said patterned magnetic thin film in said applying step is at an angle no greater than 75° with respect to a lengthwise direction of said patterned magnetic thin film; and testing said patterned magnetic thin film after said step of applying a magnetic field to said patterned magnetic thin film to determine whether said patterned thin film is defective, wherein said magnetoresistance element has at least two different magnetic thin film patterns patterned in directions crisscrossed with respect to each other at a right angle, and wherein said magnetic field application direction in said magnetic field application step is within ±30° from a reference direction at an angle of 45° with respect to lengthwise directions of respective magnetic thin film patterns.

4. The method of manufacturing a magnetoresistance element comprising the steps of:

forming a magnetic thin film on a substrate;

patterning said magnetic thin film into a pattern having long sides and short sides;

applying a magnetic field to said patterned magnetic thin film after said patterning step, wherein a direction of said magnetic field applied to said patterned magnetic thin film in said applying step is at an angle of no greater than 75° with respect to a lengthwise direction of said patterned magnetic thin film; and testing said patterned magnetic thin film after said step of applying a magnetic field to said patterned magnetic thin film to determine whether said patterned thin film is defective;

wherein a magnetic field application strength in said magnetic field application step is more than a saturation magnetic field in said lengthwise direction of said patterned magnetic thin film, said saturation magnetic field being a magnetic field strength at a time when a variation in a resistance of said magnetoresistance element becomes constant when a magnetic field is applied to said patterned magnetic thin film, wherein said magnetoresistance element has at least two different magnetic thin film patterns disposed in directions each other at a right angle, and wherein said magnetic field application direction in said magnetic field application step is within ±30° from a reference direction at an angle of 45° with respect to lengthwise directions of respective magnetic thin film patterns.

5. The method of manufacturing a magnetoresistance element according to claim 1, wherein a plurality of said magnetoresistance elements are formed on said substrate in a same pattern; and wherein said magnetic field is applied to said plurality of magnetoresistance elements formed on said substrate.

6. The method of manufacturing a magnetoresistance element according to claim 2, wherein plurality of said magnetoresistance elements are formed on said substrate in a same pattern; and wherein said magnetic field is applied to said plurality of magnetoresistance elements formed on said substrate.

7. The method of manufacturing a magnetoresistance element according to claim 3, wherein a plurality of said magnetoresistance elements are formed on said substrate in a same pattern; and wherein said magnetic field is applied to said plurality of magnetoresistance elements formed on said substrate.

8. The method of manufacturing a magnetoresistance element according to claim 4, wherein a plurality of said magnetoresistance elements are formed on said substrate in a same pattern; and wherein said magnetic field is applied to said plurality of magnetoresistance elements formed on said substrate.

9. The method of manufacturing a magnetoresistance element according to claim 1, wherein said step of applying said magnetic field is performed immediately before said testing step.

10. The method of manufacturing a magnetoresistance element according to claim 2, wherein said step of applying said magnetic field is performed immediately before said testing step.

11. The method of manufacturing a magnetoresistance element according to claim 3, wherein said step of applying said magnetic field is performed immediately before said testing step.

12. The method of manufacturing a magnetoresistance element according to claim 5, wherein said step of applying said magnetic field is performed immediately before said testing step.

13. The method of manufacturing a magnetoresistance element according to claim 1, wherein said angle of said magnetic field application with respect to said lengthwise direction of said patterned magnetic thin film is not greater than 60°.

14. The method of manufacturing a magnetoresistance element according to claim 1, wherein an atmospheric temperature in said magnetic field application step is Curie temperature, which is a temperature marking a transition between ferromagnetism and paramagnetism and is particular to each material.

15. The method of manufacturing a magnetoresistance element according to claim 4, wherein said step of applying said magnetic field is performed immediately before said testing step.

16. The method of manufacturing a magnetoresistance element according to claim 3, wherein an atmospheric temperature in said magnetic field application step is Curie temperature, which is a temperature marking a transition between ferromagnetism and paramagnetism and is particular to each material.

17. The method of manufacturing a magnetoresistance element according to claim 4, wherein an atmospheric temperature in said magnetic field application step is Curie temperature, which is a temperature marking a transition between ferromagnetism and paramagnetism and is particular to each material.

* * * * *